(12) United States Patent
Chen et al.

(10) Patent No.: US 8,189,419 B2
(45) Date of Patent: May 29, 2012

(54) APPARATUS FOR NONVOLATILE MULTI-PROGRAMMABLE ELECTRONIC FUSE SYSTEM

(75) Inventors: Howard H. Chen, Yorktown Heights, NY (US); John A. Fifield, Essex Junction, VT (US); Louis C. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 12/498,175

(22) Filed: Jul. 6, 2009

(65) Prior Publication Data
US 2011/0002188 A1    Jan. 6, 2011

(51) Int. Cl.
*G11C 17/18* (2006.01)
(52) U.S. Cl. .................... 365/225.7; 365/201
(58) Field of Classification Search .......... 365/225.7, 365/201, 189.07
See application file for complete search history.

(56) References Cited

U.S. PATENT DOCUMENTS

| | | | |
|---|---|---|---|
| 5,412,593 A | 5/1995 | Magel et al. | |
| 5,966,339 A | 10/1999 | Hsu et al. | |
| 6,424,161 B2 * | 7/2002 | Damon et al. | 324/550 |
| 7,200,064 B1 | 4/2007 | Boerstler et al. | |
| 7,298,639 B2 | 11/2007 | Hsu et al. | |
| 7,405,590 B1 * | 7/2008 | Kaneko | 326/38 |
| 2004/0012070 A1 | 1/2004 | Park | |
| 2007/0081406 A1 | 4/2007 | Boerstler et al. | |
| 2008/0023789 A1 | 1/2008 | Hsu et al. | |
| 2008/0062738 A1 * | 3/2008 | Schamberger et al. | 365/96 |
| 2009/0303650 A1 * | 12/2009 | Do et al. | 361/93.7 |

* cited by examiner

*Primary Examiner* — Anh Phung
(74) *Attorney, Agent, or Firm* — Preston Young; Michael J. Chang, LLC

(57) ABSTRACT

Electronic fuse (e-fuse) systems with multiple reprogrammability are provided. In one aspect, a reprogrammable e-fuse system is provided that includes a first e-fuse string; a second e-fuse string; a selector connected to both the first e-fuse string and the second e-fuse string configured to alternately select an e-fuse from the first e-fuse string or the second e-fuse string to be programmed; and a comparator connected to both the first e-fuse string and the second e-fuse string configured to compare a voltage across the first e-fuse string to a voltage across the second e-fuse string to determine a programming state of the e-fuse system.

21 Claims, 7 Drawing Sheets

100

200

300

400

FIG. 6B
FIG. 6A
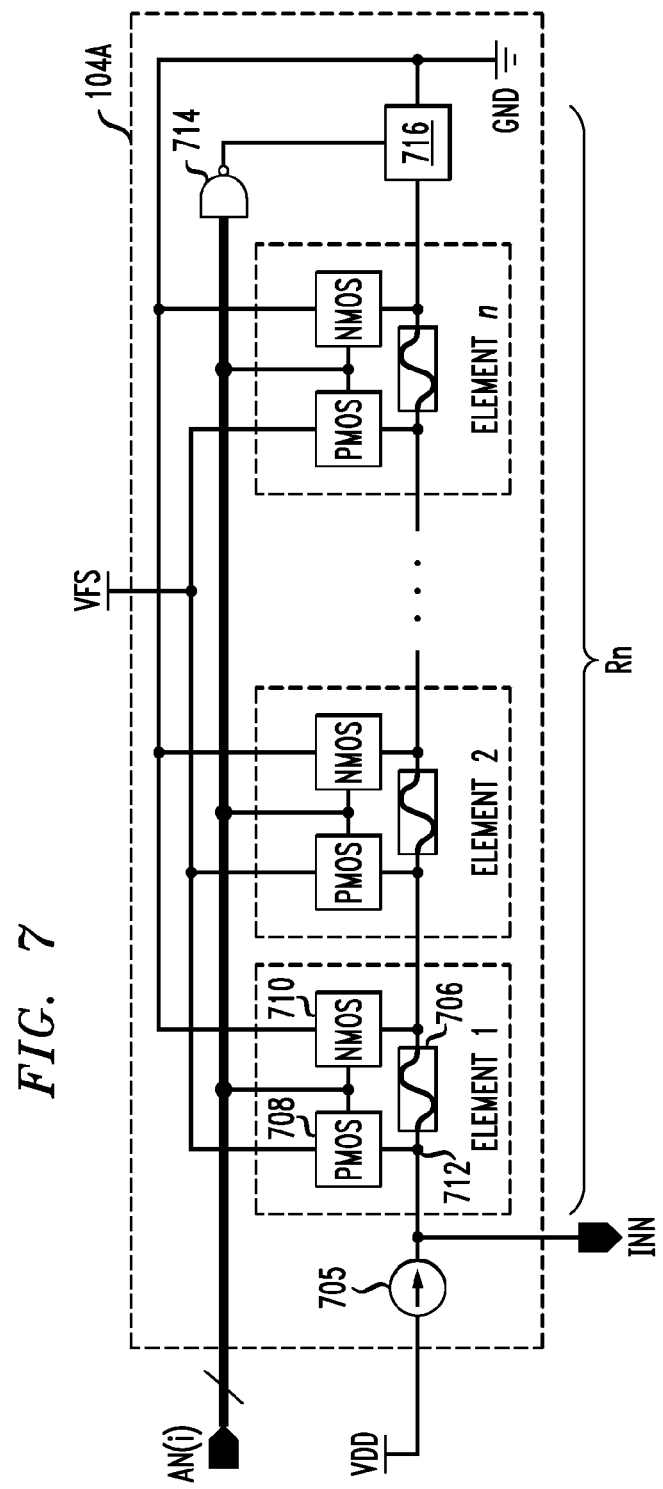
FIG. 7

900

1000

1100

APPARATUS FOR NONVOLATILE MULTI-PROGRAMMABLE ELECTRONIC FUSE SYSTEM

FIELD OF THE INVENTION

The present invention relates to electronic fuse (e-fuse) systems, and more particularly, to e-fuse systems with multiple reprogrammability.

BACKGROUND OF THE INVENTION

Programming a circuit via an electronic fuse (e-fuse) offers several advantages over traditional laser-blown fuse methodologies. First, e-fuses are substantially smaller than laser fuses. Second, an e-fuse can be blown by a logic process, instead of a laser ablation process that could damage adjacent devices. Third, the blowing of an e-fuse does not require any special equipment or a separate product flow, which is beneficial because contamination problems have been encountered when wafers leave the clean room environment (a separate product flow) for fuse programming on laser fuse equipment, and then returned for final passivation.

In general, the programming of an e-fuse involves applying a substantially high voltage or current to open a fuse element (in alternating current (AC) or direct current (DC) mode) within an integrated circuit. The programming of an e-fuse does not involve a physical rupture of the fuse element. E-fuse technology has become increasingly popular in semiconductor designs for yield improvement, circuit configuration, security activation and many other applications.

One limitation of conventional e-fuse technology is that only one-time programmability is permitted. Namely, once the fuse is blown the circuit is programmed, and it is no longer possible to restore the circuit back to its original state (reprogram the circuit) using the same e-fuse programming mechanism. However, in certain applications, having programming and reprogramming capabilities (similar to those provided by nonvolatile random access memory (NVRAM) devices) is desirable.

One technique that has been used to overcome this limitation is to incorporate anti-fuse components on the same chip. When it is necessary to reprogram a circuit, one or more anti-fuse elements are activated to reconnect the circuits. U.S. Pat. No. 5,412,593, issued to Magel et al., entitled "Fuse and Antifuse Reprogrammable Link for Integrated Circuits," discloses a fuse element that can be programmed initially, and an anti-fuse element that can be programmed in a second step to reverse the initial programming. This approach, however, involves two different programming technologies with extra fabrication steps, different programming set-ups and complicated layout designs.

In U.S. Pat. No. 5,966,339, issued to Hsu et al., entitled "Programmable/Reprogrammable Fuse," a method is described to repeatedly program and re-program a fuse circuit. Specifically, for N fuse links and N exclusive-ORs, the fuse arrangement thus formed can be reprogrammed a total of N times by sequentially blowing one fuse link at a time. In addition to the number of XOR circuit components, this method also requires one set of fuse programming and sensing circuits for each stage, because after the fuse is blown, a sensing circuit is needed to sense and output the programmed state to an XOR gate for processing.

In U.S. Pat. No. 7,200,064, issued to Boerstler et al., entitled "Apparatus and Method for Providing a Reprogrammable Electrically Programmable Fuse," a pair of e-fuses is connected to programming and sensing current sources. When the pair of e-fuses is to be programmed, a first programming current is applied to a first e-fuse to increase the resistance of the first e-fuse by an incremental amount. When the pair of e-fuses is to be returned to an unprogrammed state, a second programming current source is applied to a second e-fuse to increase the resistance of the second e-fuse to be greater than the resistance of the first e-fuse. When the sensing current is applied to the e-fuses, a difference in the resulting voltages across the e-fuses is identified and used to indicate whether the e-fuse is in a programmed state or an unprogrammed state. This process however only allows two-time programming, from the state of 0 to 1, and back to 0. Furthermore, due to a wide range of resistance variation after electromigration, it may be difficult to control the resistance of the second e-fuse to be greater than the first e-fuse after reprogramming.

Therefore, improved techniques for providing multi-programmability in an e-fuse system to facilitate repeatable circuit and code configuration would be desirable.

SUMMARY OF THE INVENTION

The present invention provides electronic fuse (e-fuse) systems with multiple reprogrammability. In one aspect of the invention, a reprogrammable e-fuse system is provided. The e-fuse system includes a first e-fuse string; a second e-fuse string; a selector connected to both the first e-fuse string and the second e-fuse string configured to alternately select an e-fuse from the first e-fuse string or the second e-fuse string to be programmed; and a comparator connected to both the first e-fuse string and the second e-fuse string configured to compare a voltage across the first e-fuse string to a voltage across the second e-fuse string to determine a programming state of the e-fuse system.

In another aspect of the invention, a method of programming a reprogrammable e-fuse system having a first e-fuse string, a second e-fuse string and a selector connected to both the first e-fuse string and the second e-fuse string, wherein the first e-fuse string and the second e-fuse string each comprise n number of identical e-fuse elements connected in series is provided. The method includes the following steps. A control signal is provided to the selector. The selector is used to select an e-fuse element from the first e-fuse string or the second e-fuse string. The selected e-fuse element is programmed. The providing, using and programming steps are repeated until all of the e-fuse elements in the first e-fuse string and the second e-fuse string have been programmed, each time using the selector to alternately select an e-fuse element from a different e-fuse string.

A more complete understanding of the present invention, as well as further features and advantages of the present invention, will be obtained by reference to the following detailed description and drawings.

BRIEF DESCRIPTION OF THE DRAWINGS

FIG. 6A is a schematic diagram illustrating an unprogrammed e-fuse device according to an embodiment of the present invention;

FIG. 6B is a schematic diagram illustrating a programmed e-fuse device according to an embodiment of the present invention;

FIG. 7 is a diagram illustrating an exemplary reprogrammable e-fuse string according to an embodiment of the present invention;

DETAILED DESCRIPTION OF PREFERRED EMBODIMENTS

Figure 1:
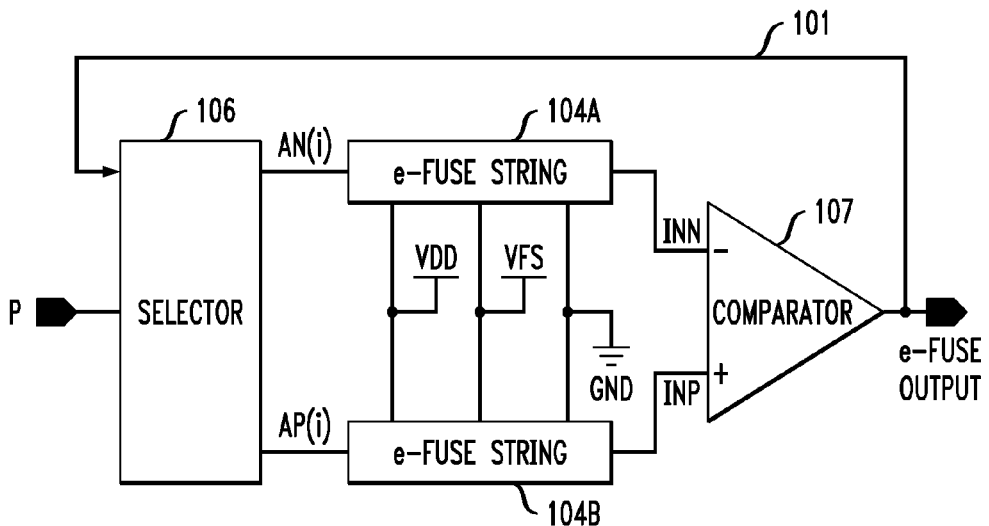
FIG. 1 is a circuit block diagram illustrating an exemplary multi-stage reprogrammable electronic fuse (e-fuse) system according to an embodiment of the present invention.

FIG. 1 is a circuit block diagram illustrating exemplary multi-stage reprogrammable electronic fuse (e-fuse) system 100. In order to design an e-fuse system with multiple programming capabilities, the present reprogrammable e-fuse system comprises a selector 106 connected to a pair of asymmetrical e-fuse strings, i.e., first e-fuse string 104A and second e-fuse string 104B, and a comparator 107. Selector 106 is configured to alternately select an e-fuse from the first e-fuse string or the second e-fuse string to be programmed. Specifically, during each programming step, the e-fuse selection alternates between the first and second e-fuse strings. According to an exemplary embodiment, selector 106 comprises an address decoder that is configured to, upon receipt of a control signal (P), generate an address that is used to select a particular e-fuse within either the first e-fuse string or the second e-fuse string to be programmed. Comparator 107 is connected to both the first and second e-fuse strings (i.e., at output nodes INN and INP) and is configured to compare a voltage across the first e-fuse string to a voltage across the second e-fuse string (i.e., at output nodes INN and INP) and measure a resistance difference between the two strings to determine a programming state of the e-fuse system (see below). An exemplary address decoder configuration is shown, for example, in FIG. 10, and an exemplary comparator is shown, for example, in FIG. 11, both described in detail below.

Figure 3:
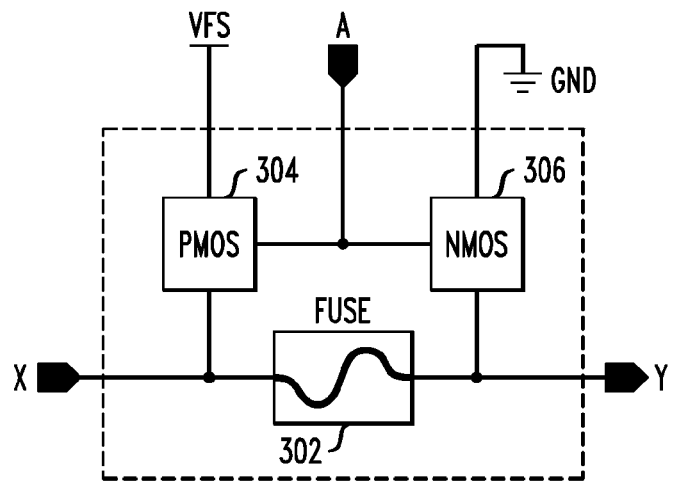
FIG. 3 is a circuit block diagram illustrating an exemplary e-fuse element according to an embodiment of the present invention.
Figure 12A:
FIG. 12A is a diagram illustrating a comparison of e-fuse string resistance before programming according to an embodiment of the present invention.
Figure 12B:
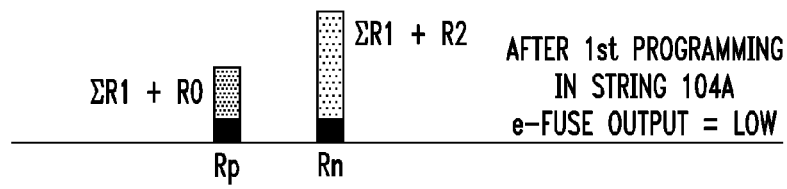
FIG. 12B is a diagram illustrating a comparison of e-fuse string resistance after a first programming step according to an embodiment of the present invention.
Figure 12C:
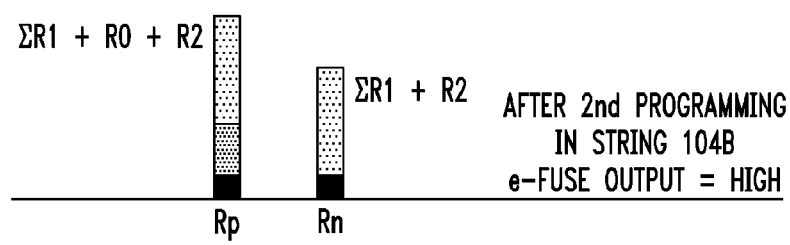
FIG. 12C is a diagram illustrating a comparison of e-fuse string resistance after a second programming step according to an embodiment of the present invention.

Each of e-fuse strings 104A and 104B contains a plurality of e-fuse elements (n number of elements). A circuit block diagram of an e-fuse element is shown in FIG. 3, described below. The number of e-fuse elements in each of e-fuse strings 104A and 104B depends on the power supply (VDD) level, fuse resistivity and process control. In general, the higher the supply voltage, the smaller the fuse size, the better the process control on fuse resistivity and the greater the number of e-fuse elements that can be implemented. As shown in FIG. 1, connections to e-fuse programming supply voltage (VFS) and ground (GND) are also provided to each string. A resistance comparison between e-fuse strings 104A and 104B both before and after two programming steps is shown in FIGS. 12A-C, described below.

During operation, e-fuse elements to be programmed will be selected alternately, i.e., from the first e-fuse string, then from the second e-fuse string, back to the first e-fuse string, and so on. Thus, a feedback loop from the e-fuse output to selector 106, e.g., an address decoder, is provided through wire 101 to determine at any given point in the programming process whether the next fuse to be blown is in the first e-fuse string or second e-fuse string.

Various components of e-fuse system 100, such as selector 106 and comparator 107, may be operated under the control of an apparatus, such as apparatus 1300 of FIG. 13, described below. Additionally, such an apparatus may be employed to provide the control signal(s) used in programming e-fuse system 100.

Figure 2:
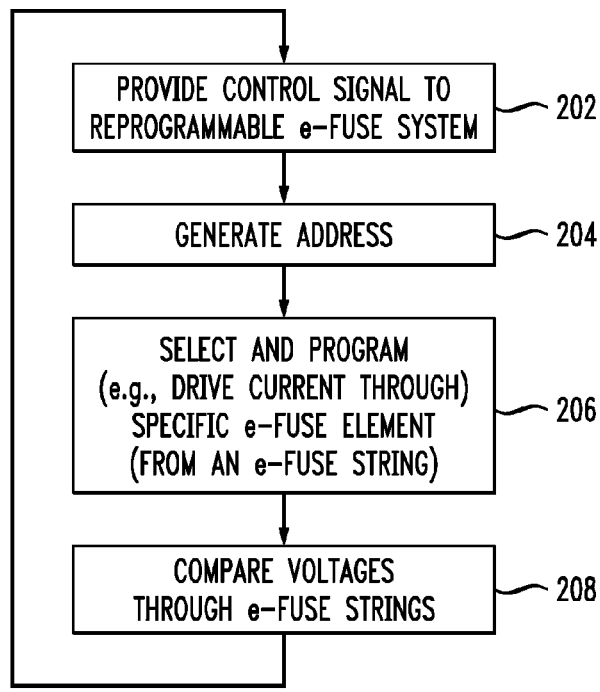
FIG. 2 is a diagram illustrating an exemplary methodology for programming an e-fuse system having multi-stage reprogramming capabilities according to an embodiment of the present invention.

FIG. 2 is a diagram illustrating exemplary methodology 200 for programming an e-fuse system having multi-stage reprogramming capabilities, such as e-fuse system 100 described in conjunction with the description of FIG. 1, above. In step 202, a control signal is provided to the e-fuse system, e.g., from a fuse controller which can comprise logic to provide timing of power-on, read signals and programming signals in response to external inputs. With reference to e-fuse system 100, the control signal (P) is provided to selector 106 (which as described above can be an address decoder) that upon receipt of the control signal (P) generates an address that is used to select a particular e-fuse within either the first e-fuse string or the second e-fuse string to be programmed, as in step 204. In step 206, the address is used to select a specific e-fuse element within either the first e-fuse string (e-fuse string 104A) or the second e-fuse string (e-fuse string 104B). For example, with reference to e-fuse system 100 when a control signal (P) is sent to reprogrammable e-fuse system 100, selector 106 (e.g., an address decoder) generates address AN(i) or AP(i) to select a specific e-fuse element within string 104A or 104B, respectively, to be programmed. The selected e-fuse element is then programmed.

As will be described in detail below, according to an exemplary embodiment, one of the e-fuse strings can comprise an additional resistive element R0 in order to permit comparison of the resistance of the e-fuse strings during multiple programming steps (i.e., one e-fuse string will always have a higher resistivity than the other). The presence of the additional resistive element is what is being referred to above where it is indicated that the e-fuse strings are asymmetric. The additional resistive element can be placed in either the first e-fuse string or the second e-fuse string. For the present description, the second e-fuse string (104B) has been selected to contain the additional resistive element. The additional resistive element will give the second e-fuse string a higher initial resistivity (i.e., before any programming has taken place). Thus, in that instance, the first e-fuse element to be programmed should be selected from the first e-fuse string. To program a particular e-fuse element, a large current is driven through the associated e-fuse device in the element to force migration of a conductive metal silicide layer of the e-fuse device (see FIG. 4, described below) thereby "opening" the e-fuse.

If an element in string 104A is selected and programmed, the resistance of string 104A will become greater than the resistance of string 104B. Consequently, the voltage at node INN will be higher than the voltage at node INP. Similarly, if an element in string 104B is selected and programmed, the resistance of string 104B will become greater than the resistance of string 104A, and the voltage at node INP will be higher than the voltage at INN.

In step 208, during a sensing mode, the voltages across the e-fuse strings are compared. For example, with reference to e-fuse system 100, comparator 107 is used to compare the voltages at node INP (i.e., VINP) and INN (i.e., VINN) and measure the resistance difference between the e-fuse strings to determine the programming state of the e-fuse system. If VINP>VINN, then e-fuse output will be "unprogrammed (HIGH)." Otherwise, if VINN>VINP, the e-fuse output will be "programmed (LOW)." The act of changing the state of e-fuse system 100 from an "unprogrammed (HIGH)" state to a "programmed (LOW)" state and vice versa is referred to herein generically as the "programming" of e-fuse system 100.

The steps of methodology 200 can be repeated until all of the elements in each e-fuse string have been exhausted. As highlighted above, a feedback loop from the e-fuse output to selector 106 is provided through wire 101 to determine whether the next fuse to be blown is in string 104A or string 104B. Each iteration of methodology 200 alternates between the elements in string 104A or string 104B. When an additional resistive element is present, e.g., in the second e-fuse string, then the first e-fuse element to be programmed in methodology 200 should be selected from the first e-fuse string.

Therefore, by alternately "blowing" (i.e., programming) the e-fuse elements and changing the electrical resistance of e-fuse strings 104A and 104B, the state of the e-fuse system 100 can be changed from "programmed" to "unprogrammed," and vice versa. Since the nonvolatile e-fuse output will not change its state when power is turned off and back on, the e-fuse output can be used to "remember" which e-fuse string's turn it is to be programmed. With existing e-fuse technology, by blowing the silicide layer while leaving the poly-silicon layer intact (see below) can achieve a reasonable resistance ratio (R1/R2), before and after each fuse is blown.

As highlighted above, one or more of the components of e-fuse system 100, such as selector 106 and comparator 107, may be operated under the control of an apparatus, such as apparatus 1300 of FIG. 13, described below. Additionally, apparatus 1300 may be employed to provide the control signal(s) used in programming e-fuse system 100. Accordingly, apparatus 1300 may be configured to perform one or more of the steps of methodology 200.

Each e-fuse element contains a pair of switches (transistors) configured to execute the programming of the e-fuse in response to a particular control signal. FIG. 3 is a circuit block diagram illustrating exemplary e-fuse element 300. E-fuse element 300 comprises e-fuse device 302, p-channel metal oxide semiconductor (PMOS) switch 304 and n-channel metal oxide semiconductor (NMOS) switch 306. Specifically, an anode of e-fuse device 302 is connected to an input pin X and a drain node of PMOS switch 304. A source node of switch 304 is connected to fuse programming supply voltage VFS. Similarly, a cathode of e-fuse device 302 is connected to an output pin Y and a drain node of NMOS switch 306. The source node of switch 306 is connected to a ground node GND. An address control pin A is provided to control the switching of each fuse element. It is conceivable that two complementary input signals are needed to control switches 304 and 306.

Figure 4:
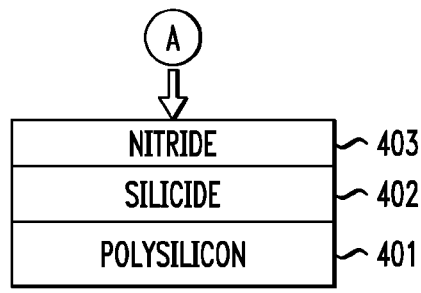
FIG. 4 is a cross-sectional diagram illustrating an exemplary e-fuse device according to an embodiment of the present invention.

FIG. 4 is a cross-sectional diagram illustrating exemplary e-fuse device 400. E-fuse device 400 represents one possible configuration of e-fuse device 302 in e-fuse element 300 (described in conjunction with the description of FIG. 3, above). E-fuse device 400 comprises conductive metal silicide layer 402 formed between nitride overlayer 403 and polysilicon layer 401 (which has a higher resistance than metal silicide layer 402, see below). Low-doped, or intrinsic polysilicon has a high resistance and is preferred to form the higher resistance polysilicon layer 401. The principle here is since conductivity of silicide is much higher than polysilicon, a majority of current will flow through the thin silicide layer during programming and cause it to break. Once that happens, the overall resistance will increase by an order of magnitude since polysilicon resistance is high. A top-down view of an intact e-fuse device, i.e., from vantage point A, that includes an anode and a cathode is shown in FIG. 5.

Figure 5:
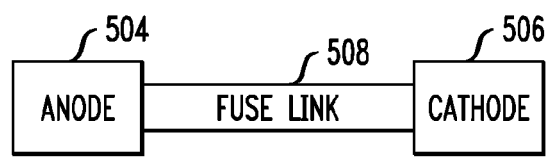
FIG. 5 is a diagram illustrating a top-down view of an e-fuse device in an intact position according to an embodiment of the present invention.

Namely, FIG. 5 is a diagram illustrating a top-down view of an e-fuse device (such as e-fuse device 400 described in conjunction with the description of FIG. 4, above) in an intact position. The conductive metal silicide layer of the e-fuse device forms a relatively thin (from about 10 nanometers (nm) to about 100 nm) conductive fuse link 508 between anode 504 and cathode 506. Fuse link 508 can be programmed by applying a predetermined voltage across anode 504 and cathode 506 via an e-fuse control logic, such as PMOS switch 304 and NMOS switch 306 of FIG. 3, described above. The voltage and time interval required to program the fuse link may vary based on physical resistance and thermal properties of the fuse link. Thus, more, or less programming time may be required to optimize the electromigration of the silicide material for good programming. In effective programming conditions, the silicided layer of the fuse link 508, will be electromigrated away, and increase the resistance of the link. If too much programming time, or programming voltage is present, silicided material may flow from the cathode/anode ends into the fuse link 508 area, and reduce the programmed resistance which is undesirable.

According to an exemplary embodiment, driving a current of about six milliamps (mA) at about 1.5 volts (V) for about five microseconds through the conductive metal silicide layer is used to increase a temperature of the silicide layer and the polysilicon layer. The voltage gradient from cathode 506 to anode 504 in turn causes electromigration and forces the metal silicide layer to migrate toward one end of the polysilicon layer. The nitride overlayer has a very high melting point and nothing will happen to it during programming. Although the current through the e-fuse is sustained as long as the polysilicon layer remains conductive, the induced electromigration has depleted the metal silicide layer from the top of the polysilicon layer, inducing an interconnect failure resulting in a less conductive e-fuse. Optimal programming is achieved without a physical rupture of the fuse link 508.

FIGS. 6A-B are schematic diagrams illustrating an unprogrammed and a programmed e-fuse device, respectively. The e-fuse device depicted in FIGS. 6A-B is configured like e-fuse device 400, described in conjunction with the description of FIG. 4, above, and comprises a conductive metal silicide layer formed between a nitride overlayer and a polysilicon layer. In FIGS. 6A-B, the polysilicon layer is represented schematically by box 601 and the conductive metal silicide layer is represented schematically by box 602. Unlike conventional e-fuse designs, the electromigration of the metal silicide layer does not completely open the electrical circuit because the polysilicon layer is left intact with its original resistance. However, in order to provide reprogramming capability, the e-fuse resistance before and after the e-fuse device is blown has to be tightly controlled.

For example, in conventional e-fuse designs, the resistance of an unprogrammed e-fuse may be in the range of from 100 ohms to 200 ohms, but the e-fuse resistance after being programmed could range from 3,000 ohms to 100,000 ohms. The wide range of open resistance is acceptable, if the e-fuse is only programmed once. For the present reprogrammable e-fuse design, however, the open resistance after the fuse is blown has to be controlled in a much tighter range, such as from about 3,000 ohms and about 4,000 ohms, which can be achieved with use of the polysilicon layer.

FIG. 7 is a diagram illustrating one exemplary configuration of first e-fuse string 104A of FIG. 1. According to this exemplary configuration, e-fuse string 104A comprises n number of identical fuse elements connected in series (i.e., labeled as "Element 1" through "Element n"). As described, for example, in conjunction with the description of FIG. 3, above, each fuse element comprises an e-fuse device (i.e., e-fuse device 706) connected to a PMOS switch (i.e., PMOS switch 708) and an NMOS switch (i.e., NMOS switch 710).

Anode 712 of the first element (Element 1) is connected to an output pin INN and an output of a constant current source 705 whose input is connected to a power supply VDD. Address signal lines AN(i) are connected to each fuse element for decoding purpose. Only one fuse element is selected each time to be activated for programming. A NAND gate 714 is used to couple all the address signals to provide the control signal to disconnect the string from the ground node via switch 716 during programming. Another switch (not shown) may optionally be inserted between the output pin INN and anode 712 of the first fuse element to disengage the fuse string from the power supply VDD during the same programming period. In a typical implementation, a fuse programming power supply voltage VFS is about the same as the input/output I/O supply voltage and about 1.5 times greater than the logic supply voltage VDD used to detect the state of the e-fuse (i.e., programmed or unprogrammed).

Figure 8:
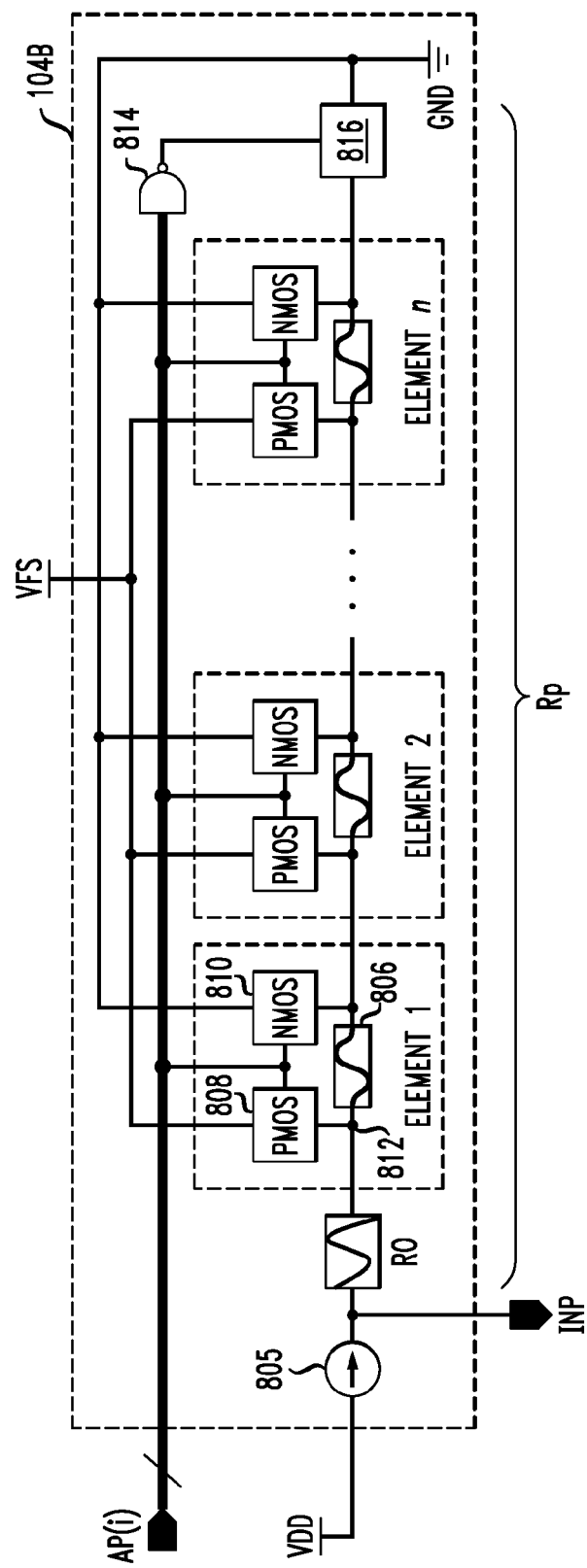
FIG. 8 is a diagram illustrating another exemplary reprogrammable e-fuse string according to an embodiment of the present invention.

FIG. 8 is a diagram illustrating one exemplary configuration of second e-fuse string 104B of FIG. 1. According to this exemplary configuration, e-fuse string 104B comprises n number of identical fuse elements connected in series (i.e., labeled as "Element 1" through "Element n"). As described above, each fuse element comprises an e-fuse device (i.e., e-fuse device 806) connected to a PMOS switch (i.e., PMOS switch 808) and an NMOS switch (i.e., NMOS switch 810).

Anode 812 of the first element (Element 1) is connected to an output pin INP through additional resistive element R0, and to an output of a constant current source 805 whose input is connected to a power supply VDD. Address signal lines AP(i) are connected to each fuse element for decoding purpose. Only one fuse element is selected each time to be activated for programming. A NAND gate 814 is used to couple all the address signals to provide the control signal to disconnect the string from the ground node via switch 816 during programming. Another switch (not shown) may optionally be inserted between the output pin INP and anode 812 of the first fuse element to disengage the fuse string from the power supply VDD during the same programming period. In a typical implementation, a fuse programming power supply voltage VFS is about the same as the input/output I/O supply voltage and about 1.5 times greater than the logic supply voltage VDD used to detect the state of the e-fuse (i.e., programmed or unprogrammed).

In contrast with the exemplary first e-fuse string configuration shown in FIG. 7 and described above, the second e-fuse string can have an extra resistive element R0 inserted between output pin INP and anode 812 of the first fuse element. The resistance value of R0 is controlled to be about one-half that of a (blown, i.e., open) programmed fuse. For example, if the resistance of an unprogrammed fuse element is R1 and the resistance of a programmed fused element is R2, a total resistance of e-fuse string 104A before programming is Rn=n*R1 (see, e.g., FIG. 7) and a total resistance of e-fuse string 104B before programming is Rp=R0+n*R1. Since the total resistance of e-fuse string 104B is higher than the total resistance of e-fuse string 104A before programming, the default reprogrammable e-fuse output is "HIGH."

Figure 9:
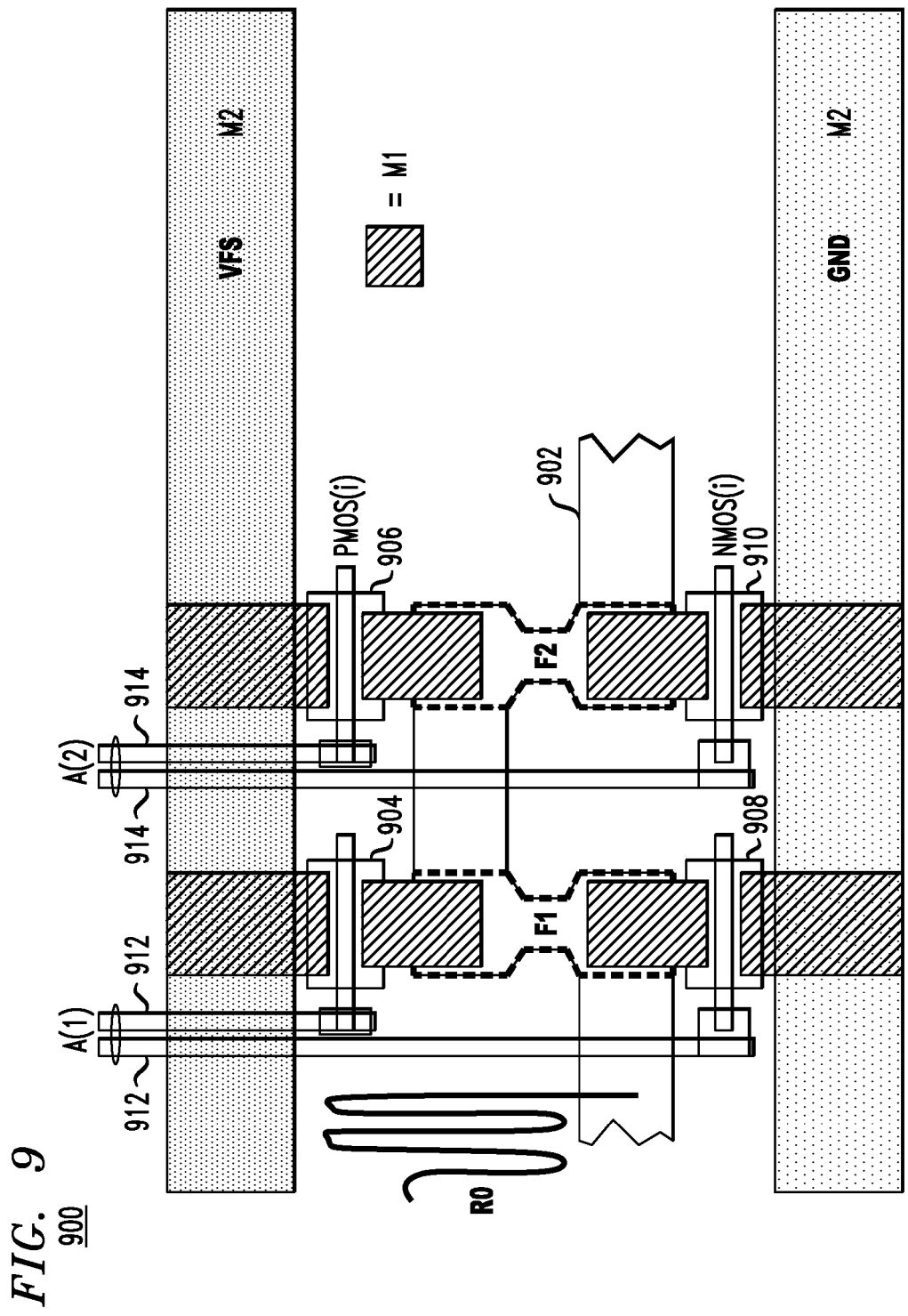
FIG. 9 is a diagram illustrating an exemplary physical layout of an e-fuse string portion of a reprogrammable e-fuse system according to an embodiment of the present invention.

FIG. 9 is a diagram illustrating exemplary physical layout 900 of a portion of an e-fuse string 902 of a reprogrammable e-fuse system, such as e-fuse system 100 of FIG. 1. E-fuse string 902 is representative of either e-fuse string 104A or 104B (having a resistive element R0) of FIG. 1. E-fuse string 902 includes identical e-fuse elements F(1), F(2), . . . , F(n). Each of these e-fuse elements contains an e-fuse device formed using silicided polysilicon layers, i.e., a conductive metal silicide layer formed between a nitride overlayer and a polysilicon layer, see for example e-fuse 400, described above. Each anode of a given one of the e-fuse elements is connected to a PMOS switch and each cathode is connected to an NMOS switch (as described above). In this example and as shown in FIG. 9, the first-level metal M1 wires (represented using a hatched pattern) are used to connect the switch devices and fuse elements, while second-level metal M2 wires (labeled VFS and GND) are used to connect the power supplies, VFS and GND. The same silicided or un-silicided polysilicon wire can be used to form resistive element R0 for the e-fuse string. Namely, in this example, all the features made by polysilicon, such as the e-fuse device and resistive element R0 can all be a nitride overlayer/conductive metal silicide layer/a polysilicon layer as shown in FIG. 4 for process simplicity and low cost. The reason that the e-fuse device will be programmed is because during programming a high-density of current flows on it. In this exemplary implementation, each of e-fuse elements F(1) and F(2) is connected to VFS by a PMOS device (i.e., PMOS devices 904 and 906), and connected to GND by an NMOS device (i.e., NMOS devices 908 and 910). The address signals A(1) and A(2) (provided to PMOS device 904/NMOS device 908 through lines 912 and to PMOS device 906/NMOS device 910 through lines 914, respectively) determine which e-fuse element is to be programmed and turn on the corresponding PMOS and NMOS devices. In this example, the circuits, components and materials used to make e-fuse strings 104A and 104B are identical. It is to be understood that one of ordinary skill in the art may implement variants of layout 900 that still fall within the confines of the present teachings.

Figure 10:
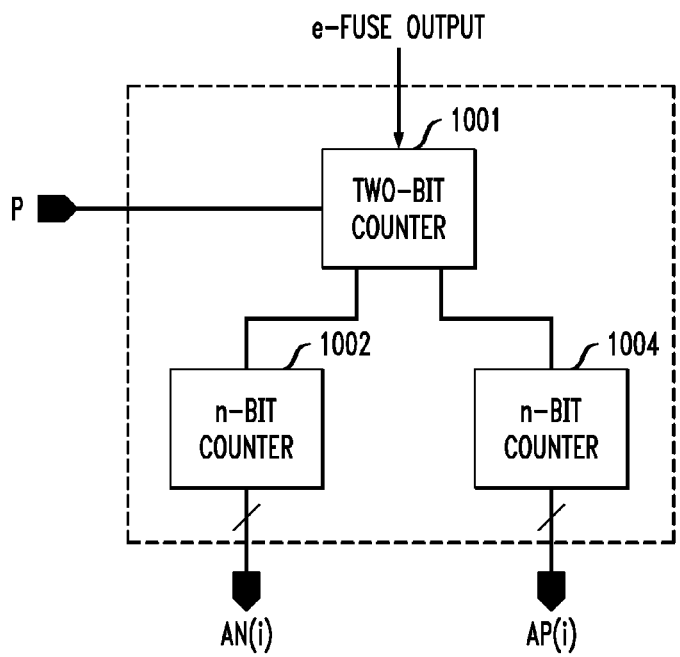
FIG. 10 is a diagram illustrating an exemplary address decoder configuration according to an embodiment of the present invention.

FIG. 10 is a diagram illustrating exemplary address decoder 1000. Address decoder 1000 comprises a two-bit counter 1001 and two n-bit counters 1002 and 1004, one for each of address signal lines AN(i) and AP(i), respectively. When the first control signal P is received, two-bit counter 1001 will trigger n-bit counter 1002 to generate a first address bit AN(1), which in turn will select the first element from the first e-fuse string (e.g., first e-fuse string 104A) for programming. When the second control signal P is received, the two-bit counter 1001 will trigger n-bit counter 1004 to generate the first address bit AP(1), which in turn will select the first fuse element from the second e-fuse string (e.g., second e-fuse string 104B) for programming. Two-bit counter 1001 will alternately select one of the two strings, and the respective n-bit counter 1002 or 1004 will sequentially select one of the n fuse elements for programming until each string has been programmed n times. The end of programmability occurs when the n-bit counter in the address decoder has reached the last e-fuse element of a string and the output can no longer change its state.

It is conceivable that two-bit counter 1001 could be replaced by a toggle flip-flop. When the toggle flip-flop receives a control signal P, it will generate an output that is the complement of the previous output.

Figure 11:
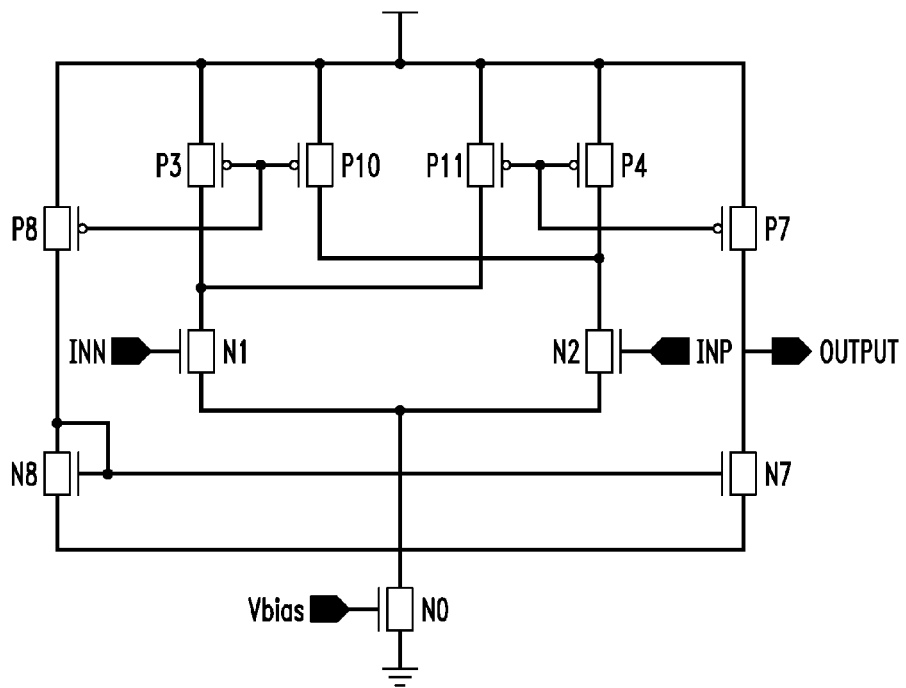
FIG. 11 is a diagram illustrating an exemplary comparator according to an embodiment of the present invention.

FIG. 11 is a diagram illustrating exemplary comparator 1100. Comparator 1100 has built-in hysteresis to filter out noise and make reliable comparison between two input signals INN and INP. In general, the overall structure and functions of a comparator are well known in the art and thus are not described further herein. However, comparator 1100 has several additional unique features that should be highlighted. First, comparator 1100 has a symmetrical design, wherein the left and right halves are mirror images of one another (including the configuration of the NMOS (N(i)) and PMOS (P(i)) transistors except for NMOS transistors N7 and N8. Second, comparator 1100 is a differential comparator, taking true/complement input signals INN and INP for comparison. Third, comparator 1100 has built-in hysteresis and is immune to noise (will not change output unless the input differential exceeds a certain level). For example, if INN−INP>50 millivolts (mV) then Vout will drop. But, when INP rises, Vout will not rise until INP−INN>50 mV.

FIGS. 12A-C are diagrams illustrating a comparison between resistance Rn (see, e.g., FIG. 7) of first e-fuse string 104A and resistance Rp (see, e.g., FIG. 8) of second e-fuse string 104B, before and after two consecutive programming steps. The resistance R1 of an unprogrammed e-fuse element is an order of magnitude lower than the resistance R2 of a programmed e-fuse element, with the extra resistance R0 in second e-fuse string 104B being about one half of the programmed resistance R2. As shown in FIG. 12A, before programming starts, R0 in second e-fuse string 104B dominates the voltage drop and Rp>Rn, which causes the comparator output state to be HIGH. As shown in FIG. 12B, after the first e-fuse element in first e-fuse string 104A is programmed, Rn of first e-fuse string 104A becomes greater than Rp of second e-fuse string 104B, so the output state changes from HIGH to LOW with an acceptable margin, as the variation of programmed resistance R2 is controlled to be relatively small compared to R0. As shown in FIG. 12C, after the first e-fuse element in second e-fuse string 104B is programmed, Rp of second e-fuse string 104B becomes greater than Rn of first e-fuse string 104A, so the output state changes from LOW back to HIGH.

In the present e-fuse programming process several assumptions are made. First, as highlighted above, Rpr>>Rupr, wherein Rpr is the resistivity of a programmed e-fuse element and Rupr is the resistivity of an unprogrammed e-fuse element. Second, Rpr=2*R0, wherein as highlighted above, R0 is the resistivity of the additional resistive element added to the second e-fuse string (i.e., e-fuse string 104B). Third, programming is started from the first e-fuse string and follows an alternating order.

Figure 13:
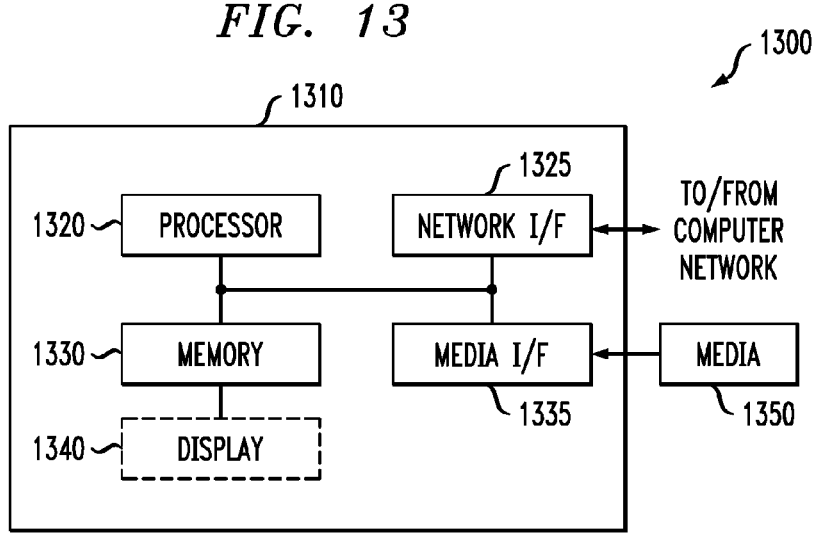
FIG. 13 is a diagram illustrating an exemplary apparatus for programming a reprogrammable e-fuse system according to an embodiment of the present invention.

Turning now to FIG. 13, a block diagram is shown of an apparatus 1300 for programming a reprogrammable e-fuse system having a first e-fuse string, a second e-fuse string and a selector connected to both the first e-fuse string and the second e-fuse string, wherein the first e-fuse string and the second e-fuse string each comprise n number of identical e-fuse elements connected in series, in accordance with one embodiment of the present invention. It should be understood that apparatus 1300 represents one embodiment for implementing methodology 200 of FIG. 2.

Apparatus 1300 comprises a computer system 1310 and removable media 1350. Computer system 1310 comprises a processor device 1320, a network interface 1325, a memory 1330, a media interface 1335 and an optional display 1340. Network interface 1325 allows computer system 1310 to connect to a network, while media interface 1335 allows computer system 1310 to interact with media, such as a hard drive or removable media 1350.

As is known in the art, the methods and apparatus discussed herein may be distributed as an article of manufacture that itself comprises a machine-readable medium containing one or more programs which when executed implement embodiments of the present invention. For instance, the machine-readable medium may contain a program configured to provide a control signal to the selector; use the selector to select an e-fuse element from the first e-fuse string or the second e-fuse string; program the selected e-fuse element; and repeat the providing, using and programming steps until all of the e-fuse elements in the first e-fuse string and the second e-fuse string have been programmed, each time using the selector to alternately select an e-fuse element from a different e-fuse string.

The machine-readable medium may be a recordable medium (e.g., floppy disks, hard drive, optical disks such as removable media 1350, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1320 can be configured to implement the methods, steps, and functions disclosed herein. The memory 1330 could be distributed or local and the processor device 1320 could be distributed or singular. The memory 1330 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1320. With this definition, information on a network, accessible through network interface 1325, is still within memory 1330 because the processor device 1320 can retrieve the information from the network. It should be noted that each distributed processor that makes up processor device 1320 generally contains its own addressable memory space. It should also be noted that some or all of computer system 1310 can be incorporated into an application-specific or general-use integrated circuit.

Optional video display 1340 is any type of video display suitable for interacting with a human user of apparatus 1300. Generally, video display 1340 is a computer monitor or other similar video display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A reprogrammable electronic fuse (e-fuse) system, comprising:

a first e-fuse string;

a second e-fuse string;

a selector connected to both the first e-fuse string and the second e-fuse string configured to alternately select an e-fuse from the first e-fuse string or the second e-fuse string to be programmed; and a comparator connected to both the first e-fuse string and the second e-fuse string configured to compare a voltage across the first e-fuse string to a voltage across the second e-fuse string to determine a programming state of the e-fuse system.

2. The e-fuse system of claim 1, wherein the selector comprises an address decoder configured to, upon receipt of a control signal, generate an address that is used to alternately select an e-fuse from the first e-fuse string or the second e-fuse string to be programmed.

3. The e-fuse system of claim 1, wherein the comparator is connected to output nodes of the first and second e-fuse strings.

4. The e-fuse system of claim 1, wherein the first e-fuse string is connected to a constant current source.

5. The e-fuse system of claim 1, wherein the second e-fuse string is connected to a constant current source.

6. The e-fuse system of claim 1, wherein the first e-fuse string and the second e-fuse string are asymmetric.

7. The e-fuse system of claim 1, wherein the first e-fuse string and the second e-fuse string each comprise n number of identical e-fuse elements connected in series, each e-fuse element comprising:

an e-fuse device; and a pair of switches connected to the e-fuse device configured to execute programming of the e-fuse device.

8. The e-fuse system of claim 7, wherein the pair of switches comprises one p-channel metal oxide semiconductor (PMOS) switch and one n-channel metal oxide semiconductor (NMOS) switch.

9. The e-fuse system of claim 7, wherein the second e-fuse string further comprises:

an additional resistive element before a first e-fuse element in the series.

10. The e-fuse system of claim 9, wherein the resistive element is configured to have a resistance value equal to about one half a resistance value of an open e-fuse device.

11. The e-fuse system of claim 7, wherein each e-fuse device comprises:

a polysilicon layer;

a nitride overlayer; and a conductive metal silicide layer in between the polysilicon layer and the nitride overlayer.

12. The e-fuse system of claim 11, wherein each e-fuse device, after being programmed, is configured to maintain a current therethrough by way of the polysilicon layer.

13. The e-fuse system of claim 2, wherein the address decoder further comprises:

a two-bit counter configured to, upon receipt of the control signal, select either the first e-fuse string or the second e-fuse string;

a first n-bit counter connected to the two-bit counter configured to select a particular e-fuse within the first e-fuse string if the first e-fuse string is selected by the two-bit counter; and a second n-bit counter connected to the two-bit counter configured to select a particular e-fuse within the second e-fuse string if the second e-fuse string is selected by the two-bit counter.

14. A method of programming a reprogrammable e-fuse system having a first e-fuse string, a second e-fuse string and a selector connected to both the first e-fuse string and the second e-fuse string, wherein the first e-fuse string and the second e-fuse string each comprise n number of identical e-fuse elements connected in series, the method comprising the steps of:

providing a control signal to the selector;

using the selector to select an e-fuse element from the first e-fuse string or the second e-fuse string;

programming the selected e-fuse element; and repeating the providing, using and programming steps until all of the e-fuse elements in the first e-fuse string and the second e-fuse string have been programmed, each time using the selector to alternately select an e-fuse element from a different e-fuse string.

15. The method of claim 14, wherein the e-fuse system further comprises an additional resistive element before a first e-fuse element in the second e-fuse string, the method further comprising the step of:

using the selector to select an e-fuse element from the first e-fuse string when none of the e-fuse elements in either the first e-fuse string or the second e-fuse string have been programmed.

16. The method of claim 14, wherein the e-fuse system further comprises a comparator, the method further comprising the step of:

using the comparator to compare a voltage across the first e-fuse string with a voltage across the second e-fuse string.

17. The method of claim 14, wherein the selector comprises an address decoder, the method further comprising the steps of:

providing the control signal to the address decoder; and using the address decoder to generate an address that is used to select an e-fuse element from the first e-fuse string or the second e-fuse string.

18. The method of claim 14, wherein each e-fuse element comprises an e-fuse device having a polysilicon layer, a nitride overlayer, and a conductive metal silicide layer in between the polysilicon layer and the nitride overlayer and wherein the programming step further comprises the step of:

driving a large current through the conductive metal silicide layer to induce electromigration and interconnect failure in the metal silicide layer.

19. The method of claim 18, further comprising the step of:

driving a current of about six milliamps at about 1.5 volts for about five microseconds through the conductive metal silicide layer to induce the electromigration and interconnect failure in the metal silicide layer.

20. An apparatus for programming a reprogrammable e-fuse system having a first e-fuse string, a second e-fuse string and a selector connected to both the first e-fuse string and the second e-fuse string, wherein the first e-fuse string and the second e-fuse string each comprise n number of identical e-fuse elements connected in series, the apparatus comprising:

a memory; and at least one processor device, coupled to the memory, operative to:

provide a control signal to the selector;

use the selector to select an e-fuse element from the first e-fuse string or the second e-fuse string;

program the selected e-fuse element; and repeat the providing, using and programming steps until all of the e-fuse elements in the first e-fuse string and the second e-fuse string have been programmed, each time using the selector to alternately select an e-fuse element from a different e-fuse string.

21. An article of manufacture for programming a reprogrammable e-fuse system having a first e-fuse string, a second e-fuse string and a selector connected to both the first e-fuse string and the second e-fuse string, wherein the first e-fuse string and the second e-fuse string each comprise n number of identical e-fuse elements connected in series, comprising a machine-readable medium containing one or more programs which when executed implement the steps of:

providing a control signal to the selector;

using the selector to select an e-fuse element from the first e-fuse string or the second e-fuse string;

programming the selected e-fuse element; and repeating the providing, using and programming steps until all of the e-fuse elements in the first e-fuse string and the second e-fuse string have been programmed, each time using the selector to alternately select an e-fuse element from a different e-fuse string.

* * * * *